US008815741B1

(12) United States Patent
Richter et al.

(10) Patent No.: US 8,815,741 B1
(45) Date of Patent: Aug. 26, 2014

(54) METHOD OF FORMING A SEMICONDUCTOR STRUCTURE INCLUDING AN IMPLANTATION OF IONS INTO A LAYER OF SPACER MATERIAL

(71) Applicant: GLOBALFOUNDRIES Inc., Grand Cayman (KY)

(72) Inventors: Ralf Richter, Radebeul (DE); Jan Hoentschel, Dresden (DE); Sven Beyer, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/793,082

(22) Filed: Mar. 11, 2013

(51) Int. Cl.
*H01L 21/311* (2006.01)
*H01L 21/265* (2006.01)

(52) U.S. Cl.
CPC .................................... *H01L 21/265* (2013.01)
USPC ............ 438/696; 438/699; 438/703; 438/733

(58) Field of Classification Search
CPC ................... H01L 21/31155; H01L 21/76859; H01L 21/47573; H01L 21/31116
USPC ......................... 438/525, 696, 699, 703, 733
See application file for complete search history.

(56) References Cited

U.S. PATENT DOCUMENTS

| 2010/0078736 | A1* | 4/2010 | Hoentschel et al. | 257/408 |
| 2010/0163939 | A1* | 7/2010 | Kronholz et al. | 257/288 |
| 2013/0288471 | A1* | 10/2013 | Chi | 438/586 |

OTHER PUBLICATIONS

Myo Min Thein, "Atomic Layer Deposition"; EE 518 Class Presentation, Penn State; pp. 1-29; 2006.*

* cited by examiner

*Primary Examiner* — Binh X Tran
(74) *Attorney, Agent, or Firm* — Amerson Law Firm, PLLC

(57) ABSTRACT

A method includes providing a semiconductor structure including a substrate and a transistor element. A layer of a spacer material is deposited over the substrate and the gate structure, wherein the deposited layer of spacer material has an intrinsic stress. Ions are implanted into the layer of spacer material. After the deposition of the layer of spacer material and the implantation of ions into the layer of spacer material, a sidewall spacer is formed at sidewalls of the gate structure from the layer of spacer material.

20 Claims, 8 Drawing Sheets

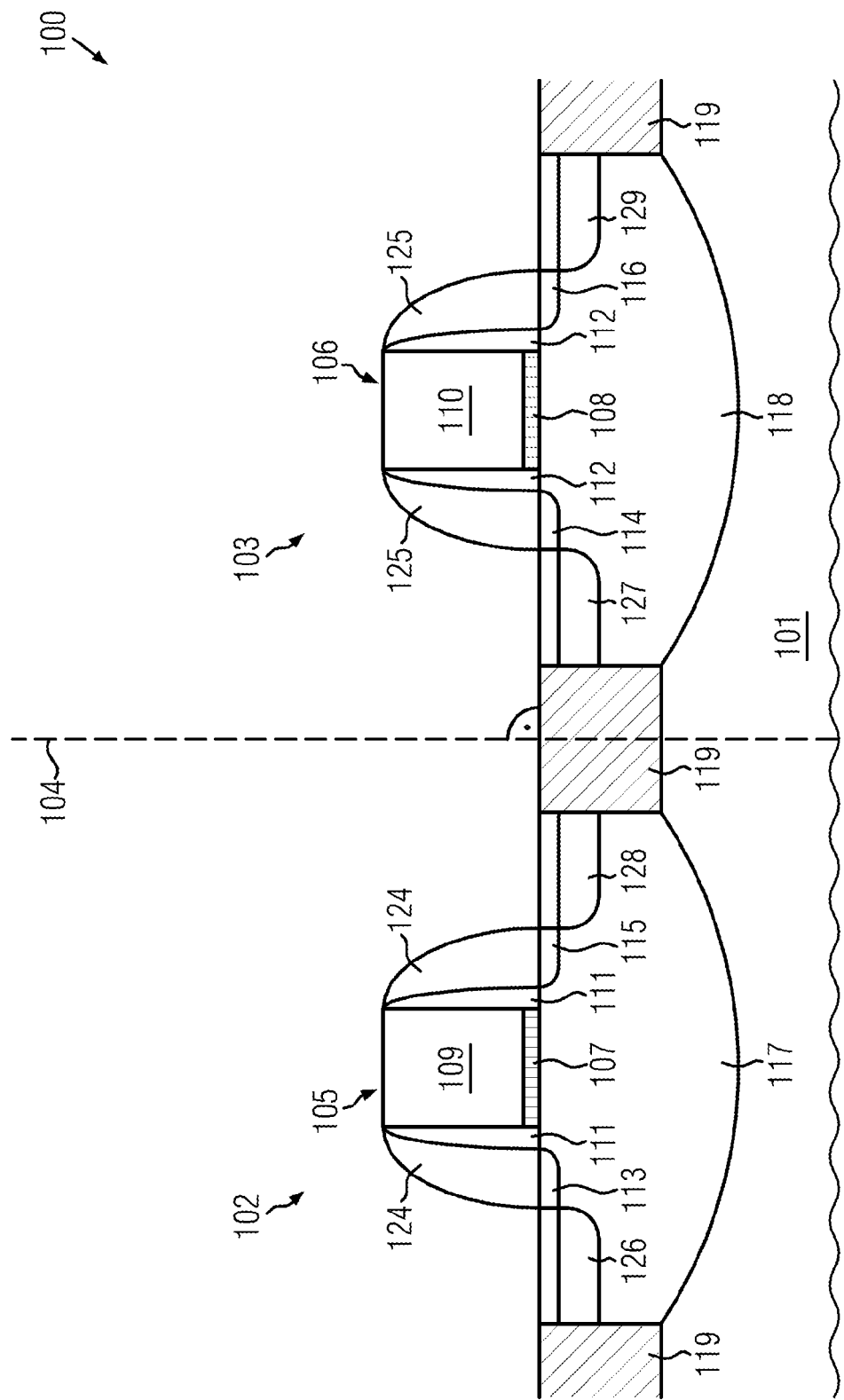

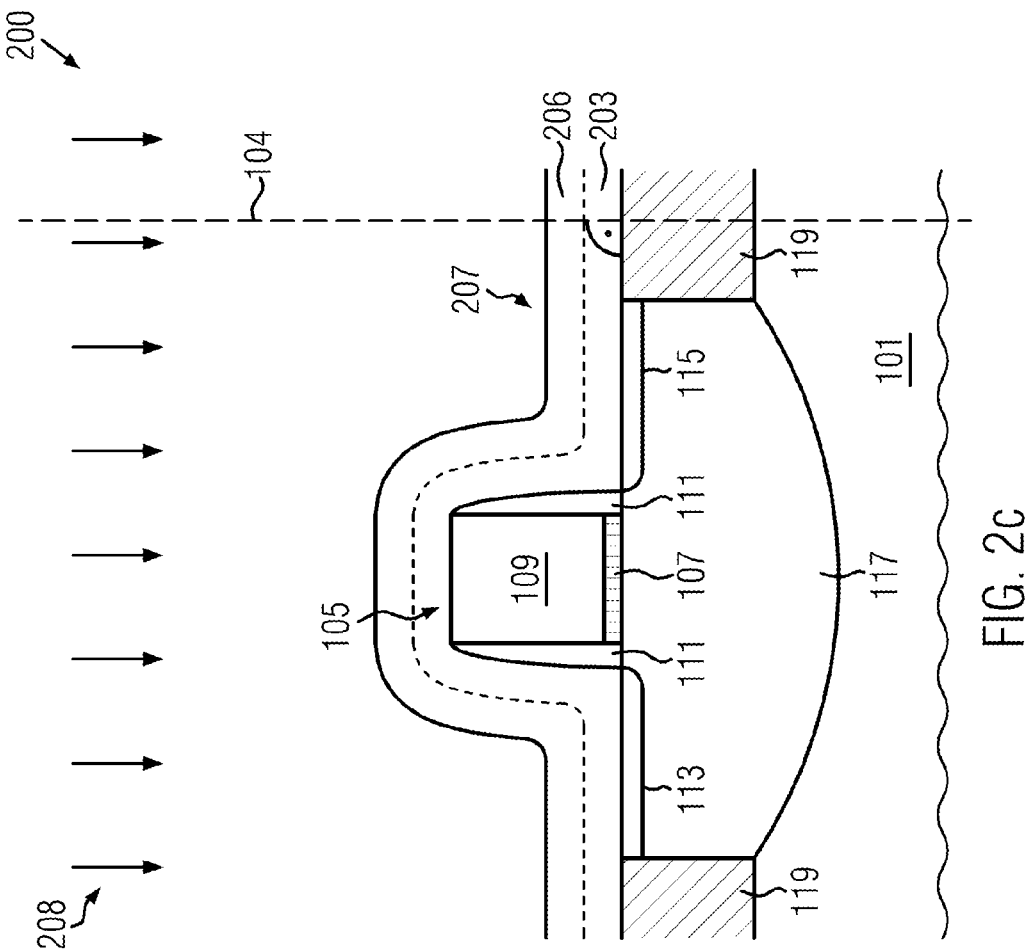

METHOD OF FORMING A SEMICONDUCTOR STRUCTURE INCLUDING AN IMPLANTATION OF IONS INTO A LAYER OF SPACER MATERIAL

BACKGROUND OF THE INVENTION

1. Field of the Invention

Generally, the present specification relates to the field of integrated circuits and, more particularly, to the formation of sidewall spacers adjacent gate electrodes of transistors.

2. Description of the Related Art

Integrated circuits typically include a large number of circuit elements, which include, in particular, field effect transistors. In a field effect transistor, a gate electrode may be separated from a channel region by a gate insulation layer that provides electrical insulation between the gate electrode and the channel region. Adjacent the channel region, a source region and a drain region are provided.

The channel region, the source region and the drain region are formed in a semiconductor material, wherein the doping of the channel region is different from the doping of the source region and the drain region. Depending on an electric voltage applied to the gate electrode, the field effect transistor may be switched between an on-state and an off-state.

For forming the source region and the drain region, one or more ion implantation processes including an irradiation with ions of a dopant material may be employed. The ion implantation processes may be performed after the formation of the gate insulation layer and the gate electrode. The gate electrode may absorb ions impinging thereon, so that substantially no ions or only a small amount of ions is implanted into the channel region below the gate electrode. Ions impinging on portions of the semiconductor material adjacent the gate electrode are included into the semiconductor material and provide the doping of the source region and the drain region.

For reducing short channel effects in field effect transistors, relatively complex dopant profiles including a source extension and a drain extension adjacent the channel region may be provided in the source region and the drain region. For providing a desired dopant profile, one or more sidewall spacers may be formed adjacent the gate electrode of a field effect transistor.

In some examples of field effect transistors, a first sidewall spacer of a first electrically insulating material, for example silicon dioxide, may be formed directly adjacent the gate electrode. After the formation of the first sidewall spacer, a first ion implantation process may be performed for forming the source extension and the drain extension.

Thereafter, a second sidewall spacer of a second electrically insulating material, for example silicon nitride, may be formed adjacent the first sidewall spacer and a second ion implantation process may be performed for forming portions of the source region and the drain region other than the source extension and the drain extension. An ion energy used in the second ion implantation process may be greater than an ion energy used in the first ion implantation process, so that portions of the source region and the drain region other than the source and drain extensions have a greater depth.

For forming a sidewall spacer adjacent a gate electrode, a layer of a spacer material from which the sidewall spacer is to be formed may be deposited. Thereafter, an anisotropic etch process may be performed. In the anisotropic etch process, portions of the layer of spacer material over substantially horizontal portions of the semiconductor structure, such as, for example, portions adjacent the gate electrode, are removed at a greater etch rate than portions of the layer of spacer material at the sidewalls of the gate electrode, so that portions at the sidewalls of the gate electrode can remain and form the sidewall spacer. For depositing the layer of spacer material, deposition processes such as, for example, plasma enhanced chemical vapor deposition may be employed. The anisotropic etch process may be a dry etch process.

Using plasma enhanced chemical vapor deposition for depositing a layer of spacer material, such as silicon nitride, may have issues associated therewith when small field effect transistors, for example, field effect transistors of technology nodes smaller than the 45 nm technology node, such as the 28 nm node, are formed.

In particular, the thickness of a silicon nitride layer deposited by plasma enhanced chemical vapor deposition may depend on the pitch between adjacent transistor devices. In transistors of the 28 nm technology node, for instance, a thickness difference between portions of a silicon nitride layer formed on single pitch field effect transistors and portions of the silicon nitride layer formed on double pitch field effect transistors, may be on the order of magnitude of about 20%.

This can lead to substantial differences of device characteristics between single pitch field effect transistors and double pitch field effect transistors, which can adversely affect the yield of a process for manufacturing a semiconductor structure. For addressing such issues, special processes for depositing a highly conformal layer from which sidewall spacers may be formed, in particular for depositing a silicon nitride layer, have been proposed. Such processes may include atomic layer deposition (ALD) and in situ radical assisted deposition (iRAD).

Processes such as atomic layer deposition and in situ radical assisted deposition may help to obtain a better conformity of a layer of spacer material, in particular of a silicon nitride layer, so that smaller thickness differences between portions of the layer on single pitch field effect transistors and portions on double pitch field effect transistors may be obtained.

However, the use of highly conformal silicon nitride layers for the formation of sidewall spacers may adversely affect the performance of P-channel transistors. For a given leakage current in the off-state, P-channel transistors including a silicon nitride sidewall spacer that has been formed from a silicon nitride layer deposited by conventional plasma enhanced chemical vapor deposition may have a substantially greater current in the on-state than a P-channel transistor including a silicon nitride sidewall spacer that has been formed from a silicon nitride layer deposited by means of in situ radical assisted deposition. A performance degradation of up to 10% has been observed in P-channel field effect transistors including a silicon nitride sidewall spacer formed from a silicon nitride layer that has been deposited by means of in situ radical assisted deposition.

The present disclosure provides manufacturing processes wherein the above-mentioned issue may be avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a substrate and a first transistor element. The first transistor element includes a first gate structure formed over the substrate. A layer of a spacer material is deposited over the substrate and the first gate structure. The deposited layer of spacer material has an intrinsic stress. Ions are implanted into the layer of spacer material, wherein the ions are irradiated to the semiconductor structure. The implantation of ions into the layer of spacer material relaxes the intrinsic stress of at least a part of the layer of spacer material. After the ion implantation, a sidewall spacer is formed at a sidewall of the first gate structure from the layer of spacer material.

Another illustrative method disclosed herein includes providing a semiconductor structure. The semiconductor structure includes a substrate and a transistor element. The transistor element includes a gate structure formed over the substrate. A first portion of a layer of spacer material is deposited over the substrate and the gate structure. Ions are implanted into the first portion of the layer of spacer material. A second portion of the layer of spacer material is deposited over the first portion of the layer of spacer material. Ions are implanted into the second portion of the layer of spacer material. At least a part of the implantation of ions into the first portion of the layer of spacer material is performed before the deposition of the second portion of the layer of spacer material.

BRIEF DESCRIPTION OF THE DRAWINGS

The disclosure may be understood by reference to the following description taken in conjunction with the accompanying drawings, in which like reference numerals identify like elements, and in which:

FIGS. 1a-1c show schematic cross-sectional views of a semiconductor structure in stages of a method according to an embodiment;

FIGS. 2a-2d show schematic cross-sectional views of a semiconductor structure in stages of a method according to an embodiment.

Figure 1A:
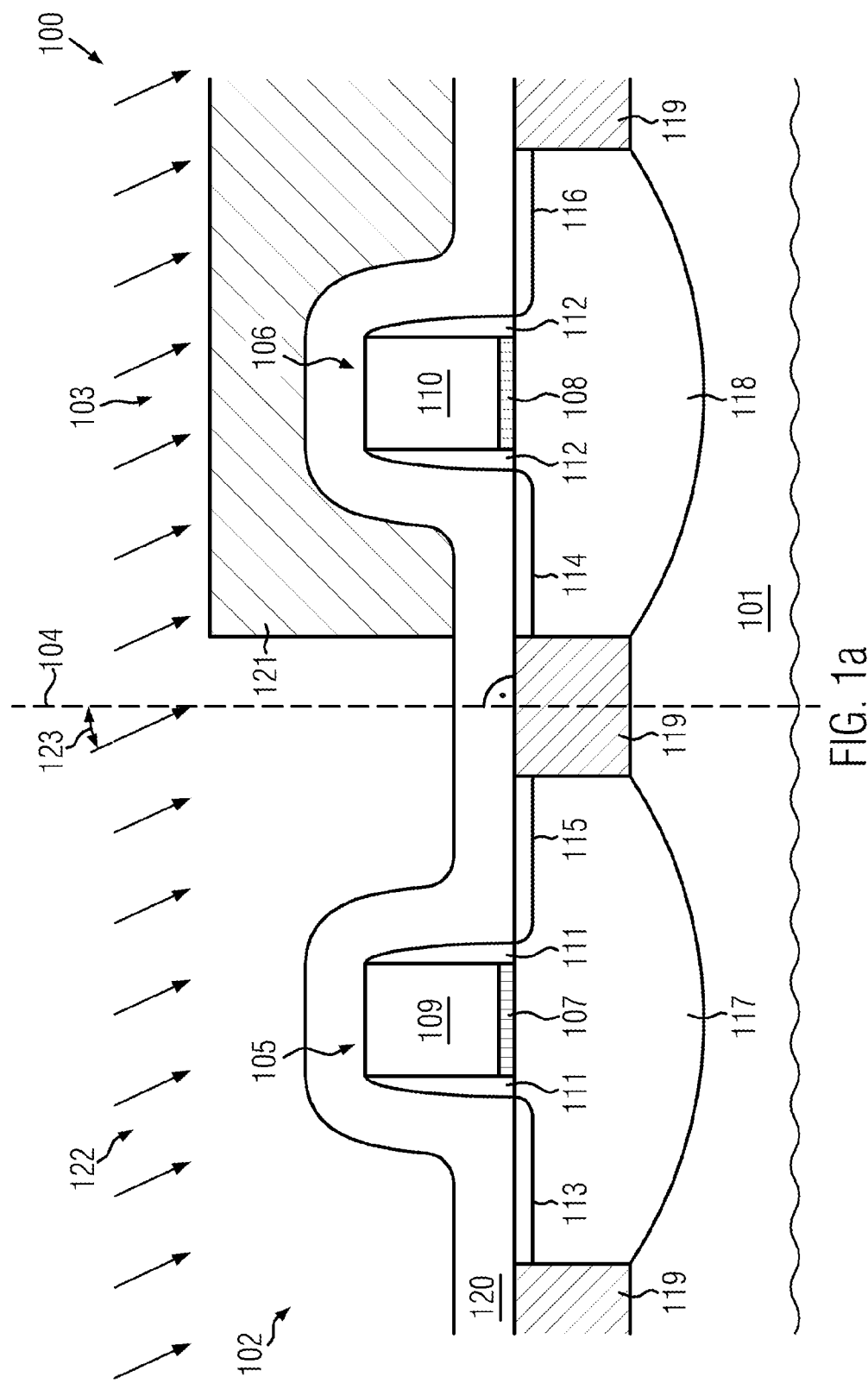

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It has been found that techniques that allow the deposition of a highly conformal layer of a spacer material, in particular a silicon nitride layer, from which sidewall spacers may be formed, may yield a relatively high intrinsic stress of the layer of spacer material. In particular, in silicon nitride layers formed by means of in situ radical assisted deposition, an intrinsic tensile stress of about 1 GPa has been observed.

Without wishing to be bound to a specific theory, it is believed that the reduced performance of P-channel transistors obtained in integrated circuits wherein sidewall spacers are formed from such layers of spacer material may be related to the presence of sidewall spacers having an intrinsic stress which can create a stress in the channel region of a transistor.

If a semiconductor material such as silicon is exposed to a tensile stress, the tensile stress may lead to a reduction of the mobility of holes. The reduction of the mobility of holes, when occurring in the channel region, may adversely affect the performance of P-channel field effect transistors. However, a tensile stress may improve the mobility of electrons, which may increase the performance of N-channel field effect transistors. Conversely, a compressive stress may increase the mobility of holes, and may reduce the mobility of electrons.

The present disclosure provides techniques wherein an ion implantation into a semiconductor structure that may relax the intrinsic stress of a layer of spacer material is performed after the deposition of the layer of spacer material, during one or more interruptions of a deposition process wherein the layer of spacer material is deposited, and/or during the deposition process. Thus, a degradation of a field effect transistor which may be caused by a stress-induced reduction of a mobility of holes or electrons in the channel regions of one or more transistors may be prevented or at least reduced.

In the ion implantation process, the layer of a spacer material, which may, for example, include silicon nitride, may be irradiated with ions of a noble gas, for example xenon, or a material from the carbon group of the periodic table of elements, for example germanium. The ion implantation may relax an intrinsic stress of the layer of spacer material, in particular an intrinsic tensile stress of a silicon nitride layer formed by means of in situ radical assisted deposition.

The relaxation of the intrinsic stress of the layer of spacer material may include a reduction of the intrinsic stress of the layer of spacer material and/or the intrinsic stress of the layer of spacer material may be brought close to zero. The ion implantation may be performed at an implantation angle in a range from about 10-40 degrees, and the semiconductor structure may be rotated during the ion implantation process. This may help to ensure that areas of the conformal layer of spacer material from which the sidewall spacer is formed, in particular areas at the sidewalls of the gate electrode of a field effect transistor, are sufficiently irradiated with ions even in the case of relatively small pitches between adjacent transistors, which entail relatively small spaces between the gate structures of adjacent field effect transistors, such as field effect transistors from the 28 nm technology node or smaller. In further embodiments, the ion implantation may be performed substantially parallel to a thickness direction of the substrate of the semiconductor structure.

In some embodiments, the deposition process employed for forming the layer of sidewall spacer material may be separated into a plurality of parts of the deposition process, with intermediate relaxation ion implantation steps. Optionally, the relaxation ion implantation may take place within the semiconductor processing tool that is employed for the deposition process. In some embodiments, the ion implantation may be performed in situ during the deposition process.

By performing a relaxation ion implantation in situ, or by separating the deposition process into a plurality of parts separated by relaxation ion implantation steps, a degradation of P-channel field effect transistors due to a crystallization of amorphous silicon during the deposition of a layer of spacer material having an intrinsic tensile stress may be avoided or at least reduced.

Optionally, a photoresist mask may be formed prior to ion implantation to cover N-channel field effect transistors which may benefit from an intrinsic tensile stress provided by sidewall spacers formed from a layer of spacer material having an intrinsic tensile stress, in particular in embodiments wherein the ion implantation is performed after the deposition of the layer of spacer material.

FIG. 1a shows a schematic cross-sectional view of a semiconductor structure 100 in a stage of a method according to the present disclosure. The semiconductor structure 100 includes a substrate 101. The substrate 101 includes a semiconductor material wherein an active region 117 of a transistor element 102 and an active region 118 of a transistor element 103 are formed.

The transistor element 102 may be a P-channel transistor element, wherein the active region 117 is doped with an N-type dopant, corresponding to the doping of the channel region of a P-channel transistor. The transistor element 103 may be an N-channel transistor element, wherein the active region 118 is P-doped, corresponding to the doping of the channel region of an N-channel transistor. A trench isolation structure 119 which may be a shallow trench isolation structure provides electrical insulation between the transistor element 102 and the transistor element 103, and between the transistor elements 102, 103 and other circuit elements in the semiconductor structure 100 (not shown).

The substrate 101 may be a bulk semiconductor substrate formed of a semiconductor material such as, for example, silicon. In other embodiments, the substrate 101 may be a semiconductor-on-insulator (SOI) substrate including a layer of a semiconductor material, for example silicon, wherein the active regions 117, 118 of the transistor elements 102, 103 are formed, that is provided above a support wafer and separated therefrom by an electrically insulating layer, for example a silicon dioxide layer. The support wafer may include a semiconductor material such as, for example, silicon.

The transistor element 102 includes a gate structure 105. The gate structure 105 may include a gate electrode 109 that is provided above the active region 117. The gate electrode 109 may include doped polysilicon and/or a metal. A gate insulation layer 107 provides electrical insulation between the gate electrode 109 and the active region 117. The gate structure 105 further includes a sidewall spacer 111 that is provided on sidewalls of the gate electrode 109 and may include an electrically insulating material such as, for example, silicon dioxide.

Adjacent the gate structure 105, a source extension 113 and a drain extension 115 are provided. The source extension 113 and the drain extension 115 may be doped with a P-type dopant, in accordance with the doping of source and drain regions that will be formed in P-type transistor element 102, as will be described below.

Similarly, the transistor element 103 includes a gate structure 106 including a gate electrode 110, a gate insulation layer 108 and a sidewall spacer 112. The gate electrode 110 may include doped polysilicon and/or a metal, and the sidewall spacer 112 may include an electrically insulating material, for example silicon dioxide. Adjacent the gate structure 106, a source extension 114 and a drain extension 116 are provided. The source extension 114 and the drain extension 116 may be doped with an N-type dopant, in accordance with the doping of source and drain regions that will be formed in N-channel transistor element 103, as will be detailed below.

The above-described features may be formed by means of known techniques for forming features of transistors in integrated circuits. In particular, techniques of photolithography, etching, oxidation and deposition may be employed for forming the trench isolation structure 119, and ion implantation processes may be used for introducing dopants into the active regions 117, 118 of the transistor elements 102, 103. When ions are implanted into the active region 117 of transistor element 102, the transistor element 103 may be covered by a mask (not shown), for example a mask including a photoresist that may be formed by means of a photolithography process. Similarly, in the formation of the active region 118 of the transistor element 103, the transistor element 102 may be covered by a mask (not shown), for example a mask including a photoresist that may be formed by means of a photolithography process. In the ion implantation processes, the masks can absorb ions, so that dopants are selectively introduced into the one of transistor elements 102, 103 that is not covered by a mask in the respective ion implantation process. Thus, the active regions 117, 118 may be differently doped.

For forming the gate structures 105, 106, a layer of a material of the gate insulation layers 107, 108, for example silicon dioxide and/or a high-k material such as hafnium dioxide and/or hafnium silicon oxynitride, may be formed on the semiconductor structure 100. On the layer of the material of the gate insulation layers 107, 108, one or more layers of materials of the gate electrodes 109, 110 may be formed. In some embodiments, the layer of the material of the gate insulation layers 107, 109 and the one or more layers of material of the gate electrodes 109, 110 may be formed by means of techniques of chemical vapor deposition and/or plasma enhanced chemical vapor deposition. Thereafter, the layers of the materials of gate insulation layers 107, 108 and the gate electrodes 109, 110 may be patterned by means of techniques of photolithography and etching.

Thereafter, the sidewall spacers 111, 112 may be formed adjacent the gate electrode 109 and the gate electrode 110, respectively. For this purpose, a layer of a material of the sidewall spacers 111, 112, for example a silicon dioxide layer, may be deposited on the semiconductor structure 100, for example by means of chemical vapor deposition or plasma enhanced chemical vapor deposition. The deposition of the layer of the material of the sidewall spacers 111, 112 may be substantially isotropic.

In isotropic deposition, a thickness of the deposited material layer, measured in a direction perpendicular to the surface portion on which the material layer is deposited, may be substantially independent on the orientation of the surface portion. In particular, a thickness of the layer of the material of the sidewall spacers 111, 112 on substantially horizontal surface portions of the semiconductor structure 100, for example on the surface of portions of the substrate 101 exposed adjacent the gate electrodes 109, 110 and on top surfaces of the gate electrodes 109, 110, may be approximately equal to a thickness of portions of the layer of the material of the sidewall spacers 111, 112 deposited on sidewalls of the gate electrodes 109, 110.

After the deposition of the layer of the material of the sidewall spacers 111, 112, an anisotropic etch process, for example a dry etch process such as a reactive ion etch process, may be performed. In anisotropic etching, an etch rate depends on an orientation of the surface of the material that is etched. The etch rate may be expressed as an amount of material that is removed per surface area and amount of time. In particular, in the anisotropic etch process, an etch rate of portions of the layer of the material of the sidewall spacers 111, 112 having a substantially horizontal surface, for example portions provided on substantially horizontal portions of the substrate 101 and portions on the top surfaces of the gate electrodes 109, 110 may be greater than an etch rate of portions of the layer of the material of the sidewall spacers 111, 112 on the sidewalls of the gate electrodes 109, 110.

The anisotropic etch process may be stopped as soon as the layer of the material of the sidewall spacers 111, 112 is removed from portions of the semiconductor structure 100 having a substantially horizontal surface. Due to the anisotropy of the etch process, portions of the layer of the material of the sidewall spacers 111, 112 on the sidewalls of the gate electrodes 109, 110 are not removed, and form the sidewall spacers 111, 112. In some embodiments, a liner layer (not shown) including a material that is different from the material of the sidewall spacers 111, 112, for example a silicon nitride layer, may be formed below the layer of the material of the sidewall spacers 111, 112, and may be employed as an etch stop layer in the anisotropic etch process.

After the formation of the sidewall spacers 111, 112, ion implantation processes may be performed for forming the source extensions 113, 114 and the drain extensions 115, 116. Similar to the formation of the active regions 117, 118, masks may be employed for selectively implanting ions of a dopant into one of the transistor elements 102, 103 while the other of the transistor elements 102, 103 is protected from irradiation with ions by a mask.

After the formation of the source extensions 113, 114 and the drain extensions 115, 116, a layer 120 of a spacer material may be deposited over the substrate 101 and the gate structures 105, 106 of the transistor elements 102, 103.

The layer 120 of spacer material may include an electrically insulating material that may be different from the electrically insulating material from which the sidewall spacers 111, 112 are formed. In embodiments wherein the sidewall spacers 111, 112 include silicon dioxide, the layer 120 of spacer material may include silicon nitride.

In some embodiments, a liner layer including a material that is different from the material of the layer 120 of spacer material, for example a silicon dioxide layer, may be deposited before the deposition of the layer 120 of spacer material. In other embodiments, the liner layer may be omitted.

In embodiments wherein a liner layer is formed below the layer 120 of spacer material, deposition processes such as, for example, chemical vapor deposition and/or plasma enhanced chemical vapor deposition may be employed for forming the liner layer.

The layer 120 of spacer material may be formed by means of techniques for forming a highly conformal layer of a spacer material such as silicon nitride. In particular, in some embodiments, the layer 120 of spacer material may be formed by means of in situ radical assisted deposition.

In in situ radical assisted deposition, a radical generating reactant may be supplied during a deposition process wherein a material to be deposited is formed from a gaseous reactant. A radical may be an atom, or a collection of atoms, which is electrically neutral, but which exists in a state of incomplete chemical bonding, making it very chemically reactive. The radical generating reactant may include, for example, hydrogen, and may be provided in addition to reactants from which the deposited material of the layer 120 of spacer material is formed.

In embodiments wherein the layer 120 of spacer material includes silicon nitride, the radical generating reactant may be provided in addition to reactants from which silicon nitride is formed such as, for example, ammonia ($NH_3$), silane ($SiH_4$) and/or dichlorosilane ($SiCl_2H_2$). From the radical generating reactant, radicals may be created in situ during the deposition process, for example, by chemical reactions with other reactants and/or due to excitation by a radio frequency plasma source.

Further features of the in situ radical assisted deposition process may correspond to features of chemical vapor deposition processes or plasma enhanced chemical vapor deposition processes for the formation of the material.

In further embodiments, an atomic layer deposition process may be used for forming the layer 120 of spacer material.

In atomic layer deposition, a first precursor and a second precursor are alternately supplied to a surface of the semiconductor structure 100. In embodiments wherein the layer 120 of spacer material includes silicon nitride, the first precursor may include silicon but no nitrogen, and the second precursor may include nitrogen but no silicon. For example, the first precursor may include monochlorosilane ($SiClH_3$), dichlorosilane ($SiCl_2H_2$), trichlorosilane ($SiCl_3H$) and/or tetrachlorosilane ($SiCl_4$). The second precursor may include ammonia ($NH_3$) and/or hydrazine ($N_2H_4$).

The atomic layer deposition process includes a plurality of atomic layer deposition cycles. Each cycle includes a first phase and a second phase. During the first phase, the first precursor is supplied to the surface of the semiconductor structure 100, but substantially no second precursor is supplied. In the second phase, the second precursor is supplied to the surface of the semiconductor structure 100, but substantially no first precursor is supplied.

Parameters of the atomic layer deposition process, such as a temperature at which the atomic layer deposition process is performed, durations of the cycles and the phases of the cycles, as well as pressures of the first and the second precursors during the first and the second phase of each atomic layer deposition cycle, may be adapted such that, during the first phase of each atomic layer deposition cycle, a monolayer of the first precursor is formed on the surface of the semiconductor structure 100. The binding of molecules of the first precursor to a monolayer of the first precursor already formed on the surface of the semiconductor structure 100 may be weaker than the binding of the molecules of the first precursor to an uncovered surface of the semiconductor structure 100. Therefore, after the formation of the monolayer of the first precursor, substantially no further deposition of the first precursor on the surface of the semiconductor structure 100 occurs.

In the second phase of each atomic layer deposition cycle, the second precursor reacts with the first precursor of the monolayer on the surface of the semiconductor structure 100, and the material of the layer 120 is formed in the reaction. The parameters of the atomic layer deposition process may be adapted such that no second precursor other than the amount of second precursor consumed in the reaction with the first precursor is deposited on the surface of the semiconductor structure 100.

Therefore, the amount of the material of the layer 120 that is formed in each atomic layer deposition cycle is substantially limited by the amount of the first precursor in the monolayer that is deposited on the surface of the semiconductor structure 100 during the first phase. Hence, the atomic layer deposition process proceeds in a self-limiting manner, wherein, in each atomic layer deposition cycle, a particular amount of the material of the layer 120 is deposited.

The thickness of the layer 120 of spacer material may be controlled by an appropriate selection of the number of atomic layer deposition cycles that is performed during the atomic layer deposition process.

Atomic layer deposition may allow the formation of a highly conformal layer 120 of spacer material, wherein the thickness of the layer 120 of spacer material depends only to a low extent on the pitch between adjacent transistor elements, such as the pitch between the transistor element 102 and the transistor element 103.

In further embodiments, the layer 120 of spacer material may be formed by means of chemical vapor deposition and/or plasma enhanced chemical vapor deposition.

The deposited layer 120 of spacer material may have an intrinsic stress. The layer 120 of spacer material may have a relatively high intrinsic tensile stress of about 1 GPa, in particular in embodiments wherein in situ radical assisted deposition and/or atomic layer deposition are employed for the formation of the layer 120 of spacer material. In further embodiments, the deposited layer 120 of spacer material may have a compressive intrinsic stress.

While in some embodiments wherein chemical vapor deposition or plasma enhanced chemical vapor deposition are used for forming the layer 120 of spacer material, the layer 120 may have an intrinsic tensile stress of about 500 MPa, which is weaker than the intrinsic stress that may be obtained when the layer 120 of spacer material is formed by means of in situ radical assisted deposition, in other embodiments wherein chemical vapor deposition or plasma enhanced chemical vapor deposition is used, a greater intrinsic stress may be obtained. For example, the layer 120 of spacer material, when including silicon nitride, may have an intrinsic tensile stress of about 1.5 GPa, or an intrinsic compressive stress of about −3.5 GPa.

The particular strength of the intrinsic stress and whether the intrinsic stress is tensile or compressive may depend on parameters of the deposition process, such as pressure, temperature and composition of reactant gases employed, and on a power of a radio frequency plasma discharge that may be created in the reactant.

After the deposition of the layer 120 of spacer material, a mask 121 may be formed over one of the transistor elements 102, 103. In particular, in embodiments wherein the layer 120 of spacer material has an intrinsic tensile stress, the mask 121 may be formed over N-channel transistor element 103.

A tensile stress in a semiconductor material such as silicon may improve the mobility of electrons, and may reduce the mobility of holes. Hence, a tensile stress in the channel region of an N-channel transistor may improve the performance of the transistor, whereas an intrinsic tensile stress in the channel region of a P-channel transistor may lead to a lower performance of the transistor. As will be detailed below, the presence of the mask 121 over the N-channel transistor element 103 may help to maintain the tensile stress of the portion of the layer 120 of spacer material over the transistor element 103, whereas the tensile stress of the portion of the layer 120 of spacer material over the transistor element 102 may be relaxed by means of an ion implantation process.

In embodiments wherein the layer 120 of spacer material has an intrinsic compressive stress, the mask 121 may be formed over transistor element 102, and transistor element 103 may be exposed.

After the formation of the mask 121, an ion implantation process may be performed, as schematically denoted by arrows 122 in FIG. 1a.

In the ion implantation process 122, the semiconductor structure 100 may be irradiated with ions. The ions may be ions of a non-doping element that substantially does not create charge carriers when it is present in the semiconductor material of the substrate 101. In some embodiments, in the ion implantation process 122, the semiconductor structure 100 may be irradiated with ions of a noble gas, for example with ions of xenon. Alternatively or additionally, the semiconductor structure 100 may be irradiated with ions of an element from the carbon group of the periodic table of elements, for example with ions of germanium.

In embodiments wherein xenon ions are used in the ion implantation process 122, the ions may have an energy in a range from about 1-100 keV. In embodiments wherein germanium ions are used, the ions may have an energy in a range from about 0.1-30 keV. A dose of ions applied in the ion implantation process 122 may be in a range from about $10^{13}$-$10^{16}$ ions/cm$^2$.

In FIG. 1a, reference numeral 104 denotes a dashed line illustrating a thickness direction of the substrate 101.

The thickness direction 104 of the substrate 101 is perpendicular to a first horizontal direction (horizontal in the view of FIG. 1a) and a second horizontal direction (perpendicular to the plane of drawing of FIG. 1a). The first horizontal direction may correspond to a length direction of the transistor elements 102, 103 extending from the source regions of the transistors that will be formed from the transistor elements 102, 103 in the manufacturing process to the drain regions of the transistors, whereas the second horizontal direction may correspond to a width direction of the transistors.

The thickness direction 104 may be substantially perpendicular to a surface of the substrate 101. Moreover, an extension of the substrate 101 in the thickness direction 104 is smaller than an extension of the substrate 101 in the first horizontal direction and the second horizontal direction that are perpendicular to the thickness direction 104. The substrate 101 may be a wafer or a die that is relatively thin, and the transistor elements 102, 103 may be formed at a surface of the wafer or die that is substantially perpendicular to the thickness direction 104 of the wafer or die.

In some embodiments, in the ion implantation process 122, the ions may be irradiated to the semiconductor structure 100 from a direction that is not parallel to the thickness direction 104, as schematically denoted by oblique arrows 122 in FIG. 1a. Reference numeral 123 schematically denotes a tilt angle between the thickness direction 104 and the direction of the movement of the ions irradiated to the semiconductor structure 100.

The orientation of the direction of movement of the ions irradiated to the semiconductor structure 100 in the ion irradiation process 122 need not be constant during the ion implantation process 122.

Figure 1B:
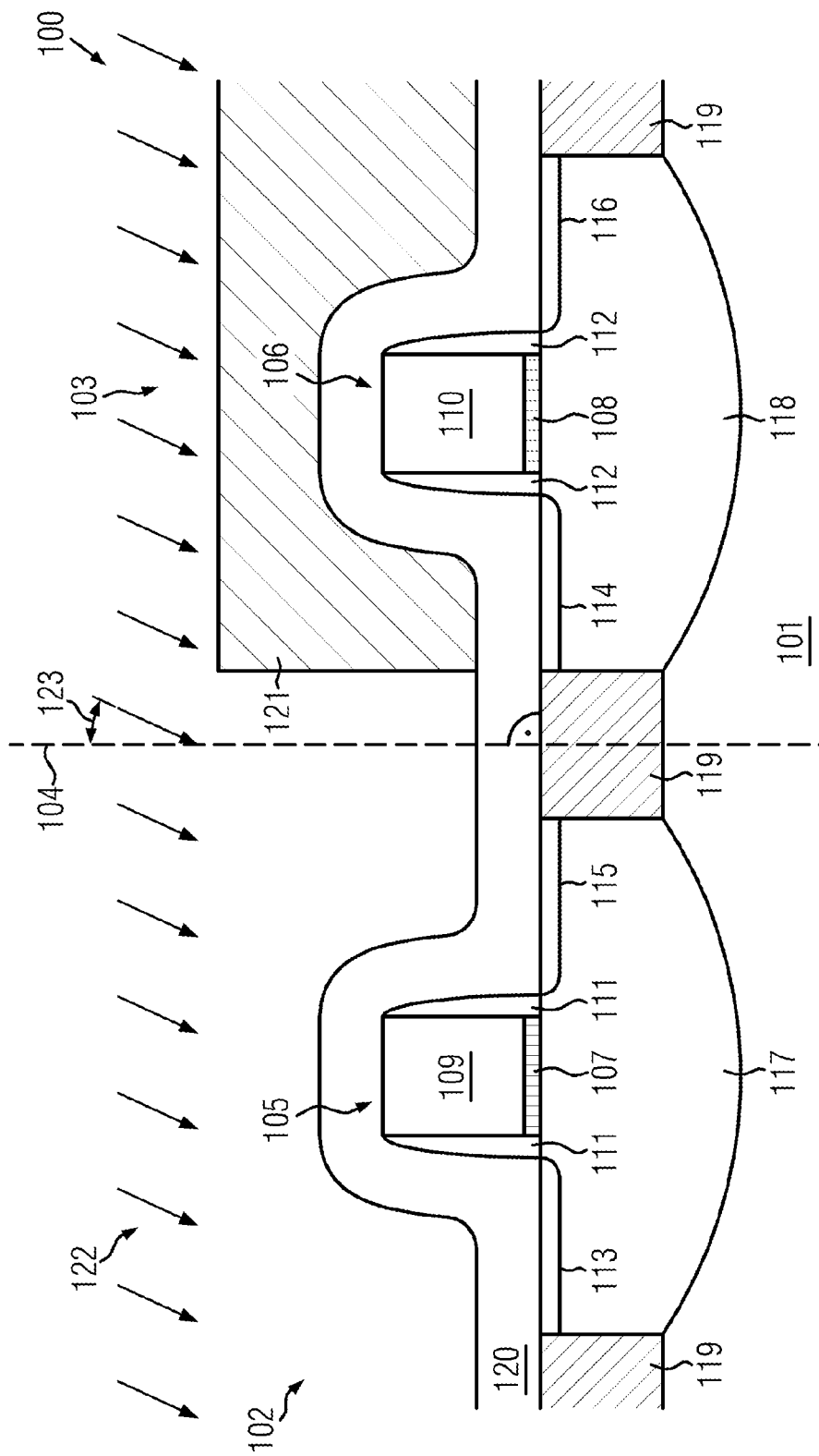

In some parts of the ion implantation process 122, the ions may impinge on the semiconductor structure 100 from the source side of the transistor elements 102, 103 (from the left in the view of FIG. 1*a*). FIG. 1*b* shows a schematic cross-sectional view of the semiconductor structure 100 during the ion implantation process 122 at a different point of time than FIG. 1*a*. As shown in FIG. 1*b*, during parts of the ion implantation process 122, the ions may impinge on the semiconductor structure 100 from the drain side of the transistor elements 102, 103 (from the right in the view of FIG. 1*b*).

However, the tilt angle 123 between the direction of movement of the ions in the ion implantation process 122 and the thickness direction 104 at the point of time illustrated in FIG. 1*a* may be approximately equal to the tilt angle between the direction of movement of the ions 122 in the ion implantation process and the thickness direction at the point of time illustrated in FIG. 1*b*.

In some embodiments, the semiconductor structure 100 may be rotated around an axis of rotation that is substantially parallel to the thickness direction 104 during the ion implantation process 122, and the direction of movement of the ions in the ion implantation process 122 may be substantially constant, and may include the tilt angle 123 with the axis of rotation. Thus, the tilt angle 123 may be substantially constant during the ion implantation process 122, whereas the direction from which ions impinge on the semiconductor structure 100 may change as the semiconductor structure 100 rotates.

Providing a nonzero tilt angle 123 between the direction of movement of the ions in the ion implantation process 122 and rotating the semiconductor structure 100 around an axis of rotation parallel to the thickness direction 104 of the substrate 101 may help to insure that substantially all the portions of the layer 120 of spacer material at the sidewalls of the gate structure 105 receive a relatively high intensity of ions at points of time during the ion implantation process 122.

At the point of time illustrated in FIG. 1*a*, portions of the layer 120 of spacer material at the source side of the gate structure 105 (on the left in the view of FIG. 1*a*) receive a relatively high intensity of ions, and portions of the layer 120 of spacer material at the drain side of the gate structure 105 (on the right in the view of FIG. 1*a*) receive a relatively low intensity of ions. At the point of time illustrated in FIG. 1*b*, portions of the layer 120 of spacer material at the drain side of the gate structure 105 receive a relatively high intensity of ions, whereas portions of the layer 120 of spacer material at the source side of the gate structure 105 receive a relatively small intensity of ions.

During the ion implantation process 122, the mask 121 formed over the transistor element 103 may absorb ions, so that the portion of the layer 120 of spacer material over the transistor element 103 receives a relatively small dose of ions, or is not irradiated with ions at all.

When ions impinge on the portion of the layer 120 of spacer material over the transistor element 102, the ions may interact with atoms in the layer 120 of spacer material. The interaction between the ions and the atoms from the layer 120 of spacer material may change the arrangement of atoms in the layer 120 of spacer material. Thereby, the intrinsic stress of the layer 120 of spacer material may be relaxed. Hence, after the ion implantation process 122, the portion of the layer 120 over the transistor element 102 may have a stress that is weaker than the intrinsic stress of the layer 120 of spacer material obtained immediately after the deposition of the layer 120 of spacer material. In some embodiments, the portion of the layer 120 of spacer material over the transistor element 102 may obtain an intrinsic stress that is approximately zero in the ion implantation process.

The tilt angle 123 between the thickness direction 104 of the substrate 101 and the direction of movement of ions in the ion implantation process may have a value in a range from about 10-40 degrees. In further embodiments, the tilt angle 123 may be approximately zero, so that the direction of movement of the ions is approximately parallel to the thickness direction.

FIG. 1*c* shows a schematic cross-sectional view of the semiconductor structure 100 in a later stage of the manufacturing process.

After the ion implantation process 122, the mask 121 may be removed. In embodiments wherein the mask 121 includes a photoresist, this may be done by means of a resist strip process.

Thereafter, an anisotropic etch process adapted to remove the material of the layer 120 of spacer material may be performed. The anisotropic etch process may be a dry etch process, for example a reactive ion etch process. The anisotropic etch process may be stopped as soon as portions of the layer 120 of spacer material over substantially horizontal portions of the semiconductor structure 100 such as the surface of the substrate 101 and the top surfaces of the gate electrodes 109, 110 are removed.

In embodiments wherein a liner layer of a material different than the spacer material is provided below the layer 120 of spacer material, the liner layer may be used as an etch stop layer. Portions of the layer 120 of spacer material at the sidewalls of the gate structures 105, 106 may remain on the semiconductor structure 100 and may form a sidewall spacer 124 at the sidewalls of the gate structure 105 and a sidewall spacer 125 at the sidewalls of the gate structure 106.

As detailed above, in the ion implantation process 122, the intrinsic stress of the portion of the layer 120 of spacer material over the transistor element 102 has been relaxed, whereas the portion of the layer 120 of spacer material over the transistor element 103 was protected from irradiation with ions by the mask 121, so that the intrinsic stress of the portion of the layer 120 of spacer material over the transistor element 103 was maintained. Therefore, the sidewall spacer 124 may have a relatively weak intrinsic stress or substantially no intrinsic stress, whereas the sidewall spacer 125 may have a relatively high intrinsic stress which, as detailed above, may be a tensile stress.

In transistor element 102, being a P-channel transistor element, the relaxation of the intrinsic stress in the sidewall spacer 124 may help to avoid a tensile stress in the channel region of the transistor element 102, which might adversely affect the mobility of holes.

In transistor element 103, being an N-channel transistor element, the intrinsic tensile stress of the sidewall spacer 125 may create a tensile stress in the channel region of the transistor element 103, which may improve the mobility of electrons in the channel region of the transistor element 103.

After the formation of the sidewall spacers 124, 125 from the layer 120 of spacer material, ion implantation processes wherein the semiconductor structure 100 is irradiated with ions of dopant materials may be performed for forming source regions 126, 127 and drain regions 128, 129 adjacent the gate structures 105, 106. The type of dopant implanted into the source regions 126, 127 and the drain regions 128, 129 may correspond to the type of the transistor elements 102, 103. In particular, a P-type dopant may be implanted into the source region 126 and the drain region 128 of the transistor element 102, and an N-type dopant may be implanted into the source region 127 and the drain region 129 of the transistor element 103. Similar to the formation of the active regions 117, 118 described above, masks (not shown) may be employed for protecting one of the transistor elements 102, 103 when ions are implanted into the source and drain region of the other of the transistor elements 102, 103.

The present disclosure is not limited to embodiments wherein one of the transistor elements 102, 103 is protected by a mask 121 during the ion implantation process 122. In other embodiments, the mask 121 may be omitted, and both the transistor element 102 and the transistor element 103 may be irradiated with ions in the ion implantation process 122. Thus, the intrinsic stress of the layer 120 of spacer material may be relaxed both in the transistor element 102 and in the transistor element 103.

Further embodiments will be described with reference to FIGS. 2a-2d.

Figure 2A:
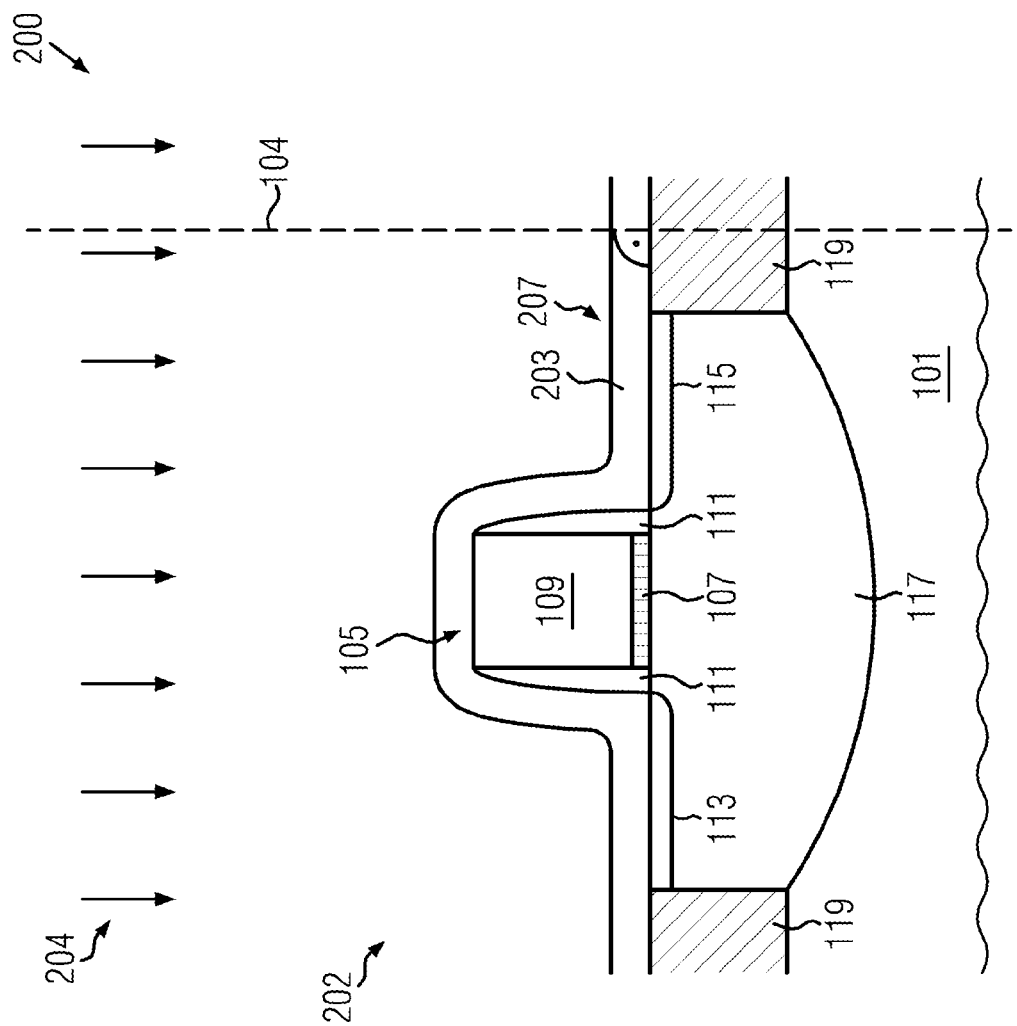

FIG. 2a shows a schematic cross-sectional view of a semiconductor structure 200 in a stage of a manufacturing process according to an embodiment. Features of the semiconductor structure 200 may correspond to features of the semiconductor structure 100 described above with reference to FIGS. 1a-1c, and, for convenience, like reference numerals have been used to denote like components. Moreover, unless stated otherwise, like methods may be used for forming features denoted by like components.

The semiconductor structure 200 includes a transistor element 202. Similar to the transistor element 102 described above with reference to FIGS. 1a-1c, the transistor element 202 may be a P-channel transistor element. In other embodiments, the transistor element 202 may be an N-channel transistor element. In addition to the transistor element 202, the semiconductor structure 200 may include further transistor elements (not shown), the type of which may be different from the type of the transistor element 202.

The semiconductor structure 200 includes a substrate 101 having a thickness direction 104. In the substrate 101, an active region 117 of the transistor element 202 that may include a source extension 113 and a drain extension 115 is provided. A trench isolation structure 119 provides electrical insulation between the transistor element 202 and other circuit elements in the semiconductor structure 200. Over the substrate 101, a gate structure 105 including a gate insulation layer 107, a gate electrode 109 and a sidewall spacer 111 is provided.

A deposition process may be performed for depositing a layer 207 of spacer material over the semiconductor structure 200. The deposition process includes a first part, wherein a first portion 203 of the layer 207 of spacer material is deposited. In FIG. 2a, the first part of the deposition process is schematically denoted by arrows 204. A second part 208 of the deposition process wherein a second portion 206 of the layer 207 of spacer material is deposited will be described below with reference to FIG. 2c.

Features of the parts 204, 208 of the deposition process used for forming the layer 207 of spacer material may correspond to features of the deposition process used for forming the layer 120 of spacer material described above with reference to FIGS. 1a-1c. In particular, the deposition process employed for forming the layer 207 of spacer material may include an in situ reactant activated deposition process, an atomic layer deposition process, a chemical vapor deposition process or a plasma enhanced chemical vapor deposition process, wherein the deposited material obtains an intrinsic stress, for example an intrinsic tensile stress. The layer 207 of spacer material may include silicon nitride.

A thickness of the portion 203 of the layer 207 of spacer material may be approximately a fraction of the total thickness of the layer 207 of spacer material. In some embodiments, a thickness of the portion 203 of the layer 207 of spacer material may be about one half of the total thickness of the layer 207 of spacer material. A duration of the part 204 of the deposition process may be a fraction of the total duration of the deposition process. In particular, the duration of the part 204 of the deposition process may be about one half of the total duration of the deposition process.

Figure 2B:
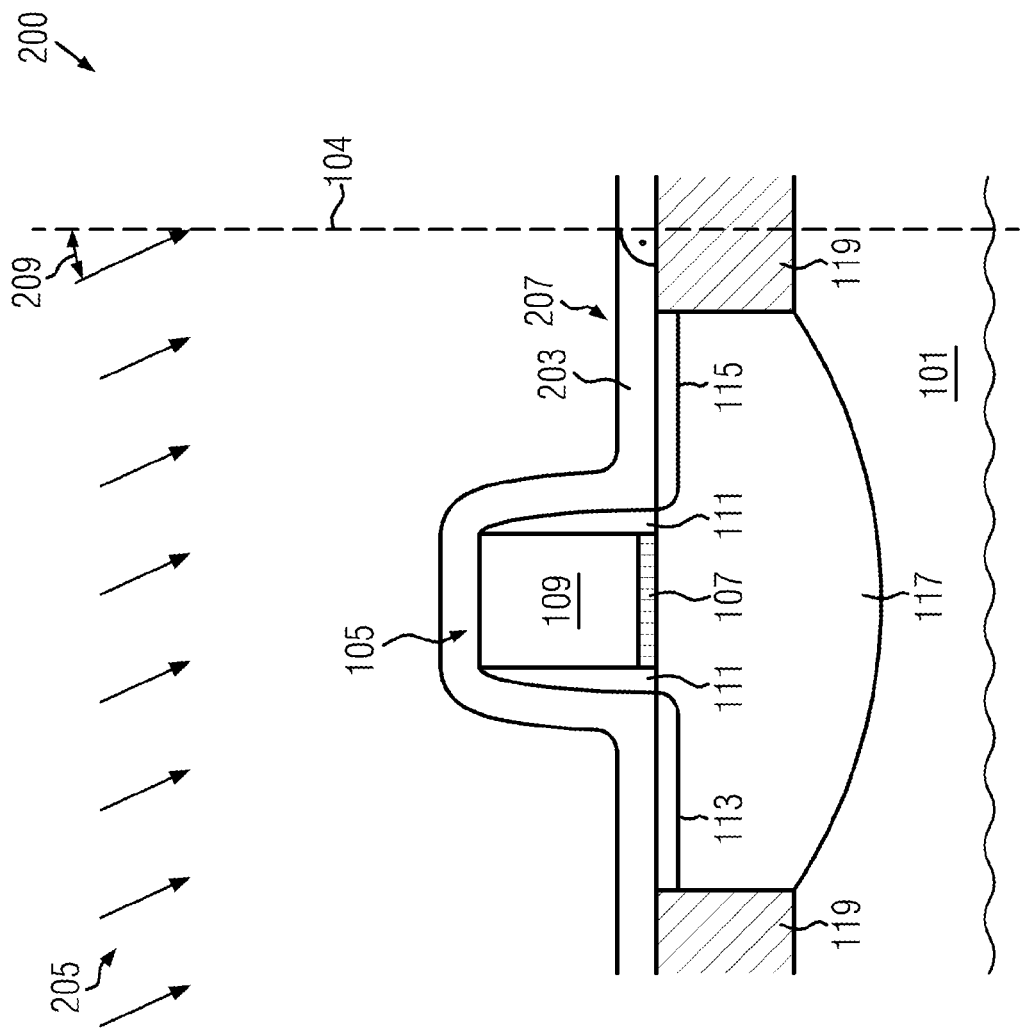

FIG. 2b shows a schematic cross-sectional view of the semiconductor structure 200 in a later stage of the manufacturing process.

After the part 204 of the deposition process, the deposition process may be interrupted, and ions may be implanted into the portion 203 of the layer 207 of spacer material. In FIG. 2b, the implantation of ions is schematically denoted by arrows 205.

Features of the ion implantation 205 may correspond to features of the ion implantation process 122 described above with reference to FIGS. 1a-1c. In particular, the ions may be irradiated to the semiconductor structure 200 at a tilt angle 209 to the thickness direction 104 of the substrate 101. The tilt angle 209 may be a nonzero tilt angle, for example, a tilt angle in a range from about 10-40 degrees, or the tilt angle 209 may be approximately zero. The ions may include ions of a noble gas, for example xenon, and/or ions from an element from the carbon group of the periodic table of elements, for example ions of germanium.

Similar to the embodiments described above with reference to FIGS. 1a-1c, the semiconductor structure 200 may be rotated around an axis of rotation that is parallel to the thickness direction 104 of the substrate 101 during the ion implantation process, so that an irradiation of substantially all the parts of the portion 203 of the layer 207 of spacer material at sidewalls of the gate structure 105 is obtained.

In the ion implantation 205, an intrinsic stress of the portion 203 of the layer 207 of spacer material may be relaxed.

FIG. 2c shows a schematic cross-sectional view of the semiconductor structure 200 in a later stage of the manufacturing process.

After the ion implantation 205, the deposition process wherein the layer 207 of spacer material is deposited may be continued, and the part 208 of the deposition process may be performed. In the part 208 of the deposition process, the portion 206 of the layer 207 of spacer material may be deposited. Features of the part 208 of the deposition process may correspond to features of the part 204 of the deposition process described above with reference to FIG. 2a, and the portion 206 of the layer 207 of spacer material may have features corresponding to those of the portion 203. In particular, thicknesses of the portions 203, 206 of the layer 207 of spacer material may be approximately equal.

Figure 2D:
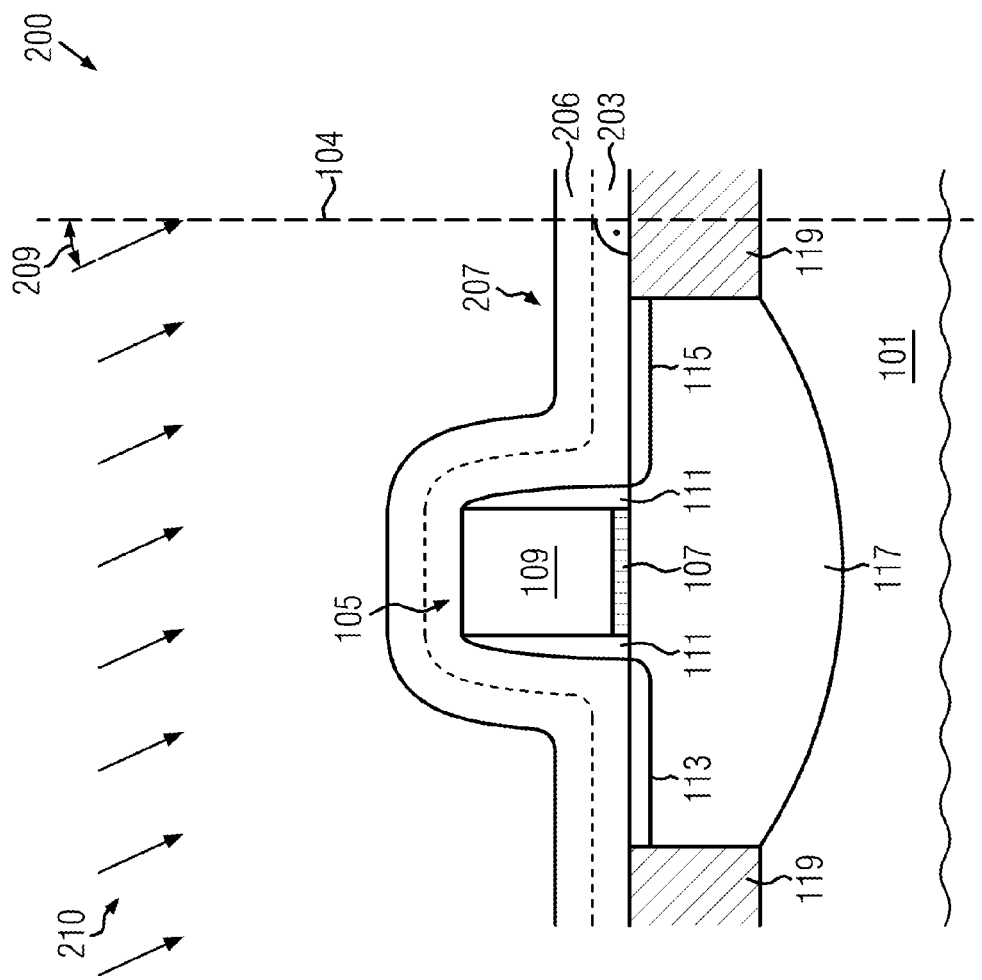

FIG. 2d shows a schematic cross-sectional view of the semiconductor structure 200 in a later stage of the manufacturing process. After performing the part 208 of the deposition process wherein the portion 206 of the layer 207 of spacer material is deposited, ions may be implanted into the layer 207 of spacer material, as schematically denoted by arrows 210 in FIG. 2d. In the ion implantation 210, ions are implanted into the portion 206 of the layer 207 of spacer material. Additionally, some of the ions irradiated to the semiconductor structure 200 in the ion implantation 210 may be implanted into the portion 203 of the layer 207 of spacer material.

Features of the ion implantation 210 may correspond to features of the ion implantation 205 described above with reference to FIG. 2b. In particular, the ion implantation 210 may be performed at a tilt angle 209 between the direction of movement of the ions and the thickness direction 104 of the substrate 101, and the semiconductor structure 200 may be rotated around an axis of rotation that is parallel to the thickness direction 104 during the ion implantation 210. The tilt angle 209 may be a nonzero tilt angle, for example a tilt angle in a range from about 10-40 degrees, or the tilt angle 209 may be approximately zero. The ions may include ions of a noble gas, for example xenon, and/or ions of an element from the carbon group of the periodic table of elements, for example ions of germanium.

In the ion implantation 210, an intrinsic stress of the portion 206 of the layer 207 of spacer material may be relaxed.

After the ion implantation 210, an anisotropic etch process may be performed for forming a sidewall spacer adjacent the gate structure 105 from the layer 207 of spacer material, and an ion implantation wherein the semiconductor structure 200 is irradiated with ions of a dopant material may be performed for forming a source region and a drain region adjacent the gate structure 105. The formation of the sidewall spacer and the formation of the source and drain regions may be performed as described above with reference to FIG. 1c.

In the method above with reference to FIGS. 2a-2d, the intrinsic stress of the portion 203 of the layer 207 of spacer material may be relaxed at least partially before the portion 206 of the layer 207 of spacer material is formed. Thus, during the formation of the portion 206 of the layer 207 of spacer material, the transistor element 202 is exposed to a less extent to stress provided by the portion 203 of the layer 207 of spacer material than it would be if the ion implantation 205 were omitted and the semiconductor structure 200 were irradiated with ions of a non-doping element only after the formation of the portion 206 of the layer 207 of spacer material.

This may help to avoid, or at least reduce a likelihood that an intrinsic stress is formed by stress memorization effects caused by the influence of the intrinsic stress of the portion 203 of the layer 207 of spacer material on amorphous silicon in the semiconductor structure 200 re-crystallizing during the deposition of the portion 206 of the layer 207 of spacer material. Thus, an adverse influence of the intrinsic stress obtained in the deposition of the layer 207 of spacer material may be further reduced.

The present disclosure is not limited to embodiments wherein the deposition of the layer 207 of spacer material is performed in two parts 204, 208, as described above with reference to FIGS. 2a-2c. In other embodiments, a greater number of parts of the deposition process may be performed. After each part of the deposition process, the deposition of material may be interrupted, and an ion implantation process may be performed similar to the ion implantations 205, 210 described above with reference to FIGS. 2b and 2d.

In some embodiments, the deposition of the layer 207 of spacer material may be separated into three or more parts, five or more parts and/or ten or more parts. In each part of the deposition process, a respective one of a plurality of portions of the layer 207 of spacer material is deposited. Between successive parts of the deposition process, the deposition process may be interrupted. During each interruption of the deposition process, ions may be implanted into one or more of the portions of the layer 207 of spacer material that have been deposited in preceding parts of the deposition process. Performing a greater number of parts of the deposition process, which are separated by ion implantation processes, may help to further reduce the stress imparted to portions of the transistor element 202 by the portions of the layer 207 of spacer material during the formation of the layer 207 of spacer material.

The implantation of ions into portions of the layer 207 of spacer material that is performed during the one or more interruptions of the deposition process performed for forming the layer 207 of spacer material may be performed in the same semiconductor processing tool as the deposition process wherein the layer 207 of spacer material is formed. In particular, the ion implantations and the parts of the deposition process may be performed in the same chamber of the same semiconductor processing tool. Thus, an exposure of the semiconductor structure 200 to an environment of the semiconductor processing tool, which might lead to a contamination of the semiconductor structure 200, may be avoided.

In alternative embodiments, the ion implantations and the parts of the deposition process used for forming the layer 207 of spacer material may be performed in different semiconductor processing tools.

Figure 3:
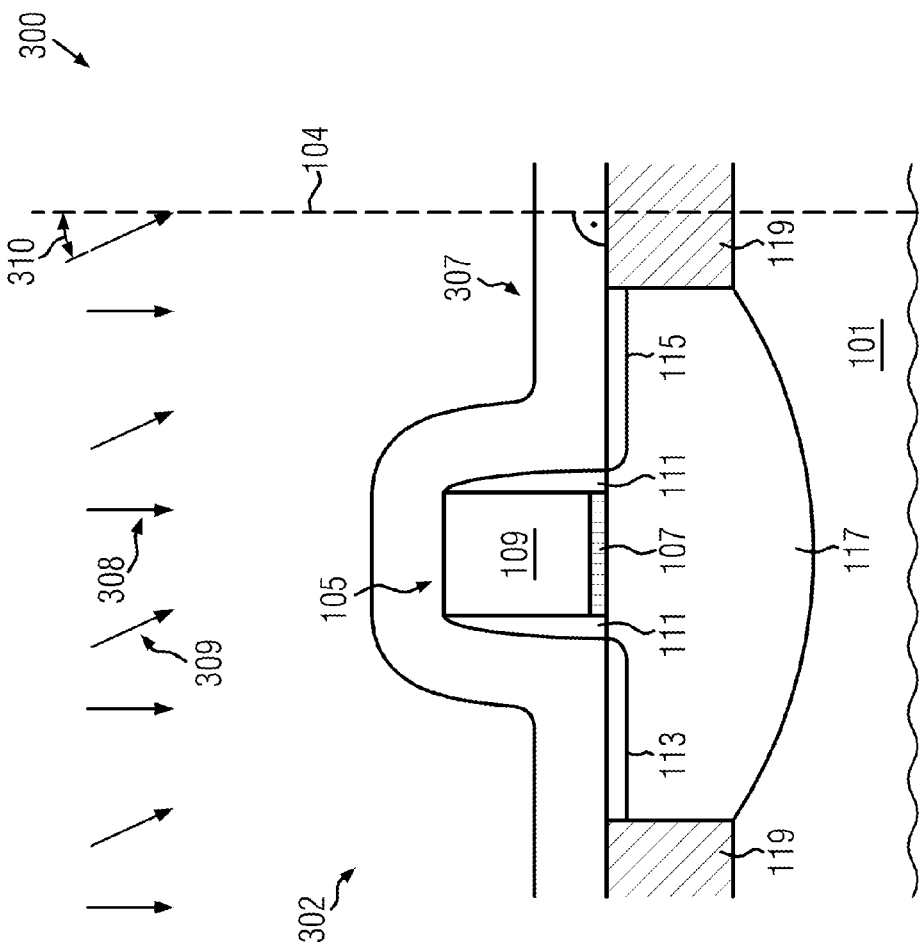
FIG. 3 shows a schematic cross-sectional view of a semiconductor structure in a stage of a method according to an embodiment.

FIG. 3 shows a schematic cross-sectional view of a semiconductor structure 300 in a stage of a manufacturing process. Some features of the semiconductor structure 300 may correspond to features of the semiconductor structures 100 and 200 described above with reference to FIGS. 1a-1c and 2a-2d, and corresponding features have been denoted by like reference numerals. Moreover, unless stated otherwise, for forming features denoted by like reference numerals, like methods may be employed.

The semiconductor structure 300 includes a substrate 101 and a transistor element 302. The transistor element 302 may be a P-channel transistor element, similar to transistor element 102 described above with reference to FIGS. 1a-1c. In other embodiments, the transistor element 102 may be an N-channel transistor element, similar to the transistor element 103 described above with reference to FIGS. 1a-1c.

The transistor element 302 includes an active region 117, which may be separated and/or electrically insulated from other portions of the semiconductor structure 300 by a trench isolation structure 119. Above the substrate 101, a gate structure 105 including a gate insulation layer 107, a gate electrode 109 and a sidewall spacer 111 is provided. In the active region 117, a source extension 113 and a drain extension 115 are provided adjacent the gate structure 105.

A layer 307 of spacer material may be deposited over the semiconductor structure 300. Features of the layer 307 of spacer material may correspond to those of the layers 120, 207 described above with reference to FIGS. 1a-2d. In particular, the layer 307 may include an electrically insulating material, for example silicon nitride.

The layer 307 of spacer material may be formed by means of a deposition process that is schematically denoted by arrows 308 in FIG. 3. Features of the deposition process 308 may correspond to those of the deposition process employed for the formation of the layer 120 of spacer material described above with reference to FIGS. 1a-1c. In particular, different from the embodiments of FIGS. 2a-2d, the deposition process 308 may be an uninterrupted deposition process, wherein no interruptions of the deposition process 308 are performed before the layer 307 of spacer material is completed.

An ion implantation process 309 is performed. The ion implantation process 309 may be an uninterrupted ion implantation process. At least a part of the ion implantation process 309 is performed during the deposition process 308, so that there is a time interval during which both an irradiation of the semiconductor structure 300 with ions and a deposition of spacer material on the semiconductor structure 300 occur.

In some embodiments, the deposition process 308 and the ion implantation process 309 may be performed substantially simultaneously. In such embodiments, the deposition process 308 and the ion implantation process 309 may be started at substantially the same point of time, and the deposition process 308 and the ion implantation process 309 may end at substantially the same point of time.

In other embodiments, the ion implantation process 309 may be started later than the deposition process 308. In such embodiments, the ion implantation process 309 may end at the same point of time as the deposition process 308, or the ion implantation process 309 may continue for an amount of time after the end of the deposition process 308.

Features of the ion implantation process 309 may be similar to features of the ion implantation processes 122, 205, 210 described above with reference to FIGS. 1a-2d. In particular, in the ion implantation process 309, the semiconductor structure 300 may be rotated around a thickness direction 104 of the substrate 101, and the irradiation with ions may be performed at a tilt angle 310 between the direction of movement of the ions relative to the semiconductor structure 300 and the thickness direction 104 of the substrate 101. The tilt angle 310 may be a nonzero tilt angle, for example a tilt angle in a range from about 10-40 degrees, or the tilt angle 310 may be approximately zero. In the ion implantation process, ions of a noble gas, for example xenon ions, or ions of an element from the carbon group of the periodic table of elements, for example germanium ions, may be used. Values of the energy of ions and/or an ion dose applied in the ion irradiation process 309 may correspond to those employed in the embodiments described above with reference to FIGS. 1a-2d.

For performing the deposition process 308 and the ion implantation process 309, the semiconductor structure 300 may be provided in a chamber of a semiconductor processing tool, wherein the semiconductor processing tool includes both equipment for performing the deposition process 308, such as, for example, supplies for reactant gases used in the implantation process 309 and, optionally, a plasma source employed in the deposition process 308. Additionally, the semiconductor processing tool may include equipment for supplying an ion beam during the deposition process 308 for performing the ion implantation process 309.

The ion beam may be created in an ion source outside the chamber of the semiconductor processing tool, and may be supplied to the chamber of the semiconductor processing tool through an opening in a wall of the chamber wherein the semiconductor structure 300 is provided. At an outer side of the opening of the chamber wall opposite the interior of the chamber wherein the semiconductor structure 300 is provided, reactant gases from the chamber that flow through the opening in the chamber wall may be removed, for example, by means of one or more vacuum pumps. Thus, the ion source may be protected from reactant gases employed in the deposition process 308.

By irradiating the semiconductor structure 300 with ions while the deposition process 308 for forming the layer 307 of spacer material is performed, substantially any stress in the layer 307 of spacer material may be relaxed as soon as it is created. Thus, an exposure of the semiconductor structure 300 to an intrinsic stress created in the layer 307 may be substantially avoided.

After the deposition process 308 and the ion implantation process 309, a sidewall spacer adjacent the gate structure 105 may be formed from the layer 307 of spacer material, and an ion implantation process wherein the semiconductor structure 300 is irradiated with ions of a dopant may be performed for forming a source region and a drain region adjacent the gate structure 105 and the sidewall spacer, as described above with reference to FIG. 1c.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor structure comprising a substrate and a first transistor element and a second transistor element, said first transistor element comprising a first gate structure formed over said substrate, said second transistor element comprising a second gate structure formed over said substrate;
depositing a layer of a spacer material over said substrate and said first and second gate structures, wherein the deposited layer of spacer material has an intrinsic stress;
forming a masking layer above the layer of spacer material, the masking layer covering a portion of the deposited layer of spacer material positioned above the second transistor and exposing a portion of the deposited layer of spacer material positioned above the first transistor;
with the masking layer in position, implanting ions into said exposed portion of the layer of spacer material positioned above the first transistor, wherein the ions are irradiated to said semiconductor structure, the implantation of ions into said exposed portion of said layer of spacer material relaxing the intrinsic stress of at least a part of said exposed portion of said layer of spacer material positioned above the first transistor;
after the ion implantation, removing the masking layer; and
forming a sidewall spacer at a sidewall of said first gate structure and a sidewall spacer at a sidewall of said second gate structure from said layer of spacer material.

2. The method of claim 1, wherein said intrinsic stress is a tensile stress, said first transistor element is a P-channel transistor element and said second transistor element is an N channel transistor element.

3. The method of claim 1, wherein said substrate has a thickness direction, wherein an extension of said substrate in said thickness direction is smaller than an extension of said substrate in a first and a second horizontal direction, and wherein the ions are irradiated to said semiconductor structure at a nonzero tilt angle to said thickness direction.

4. The method of claim 3, wherein said tilt angle is selected such that said at least a part of the layer of spacer material comprises a part of the layer of spacer material provided at a sidewall of said first gate structure.

5. The method of claim 4, wherein said tilt angle has a value in a range from about 10-40 degrees.

6. The method of claim 4, further comprising rotating said semiconductor structure around an axis of rotation that is parallel to said thickness direction during the ion implantation.

7. The method of claim 6, wherein at least a part of the ion implantation is performed after the deposition of a first portion of the layer of spacer material, and wherein a second portion of the layer of spacer material is deposited after said at least a part of the ion implantation.

8. The method of claim 6, wherein said ion implantation is performed after the deposition of the whole layer of spacer material.

9. A method, comprising:
providing a semiconductor structure comprising a substrate and a transistor element, said transistor element comprising a gate structure formed over said substrate;
depositing a first continuous portion of a layer of spacer material over said substrate and said gate structure;
implanting ions into said first continuous portion of said layer of spacer material;
with the entirety of the first continuous portion of the layer of spacer material in position over the substrate and the gate structure, conformably depositing a second continuous portion of said layer of spacer material on and in contact with the entirety of said first continuous portion of said layer of spacer material; and
implanting ions into said second portion of said layer of spacer material;
wherein at least a part of the implantation of ions into said first portion of said layer of spacer material is performed before the deposition of said second portion of said layer of spacer material.

10. The method of claim 9, wherein said first continuous portion of said layer of spacer material is deposited in a first part of a deposition process and said second continuous portion of said layer of spacer material is deposited in a second part of said deposition process, wherein said deposition process is interrupted between said first and said second part of said deposition process, and said at least a part of the implantation of ions into said first continuous portion of said layer of spacer material is performed during the interruption.

11. The method of claim 9, wherein said deposition processes and said ion implantations are performed in different semiconductor processing tools.

12. The method of claim 9, further comprising performing an anisotropic etch process to form a sidewall spacer at sidewalls of said gate structure from said layer of spacer material.

13. The method of claim 9, wherein said deposition processes and said ion implantations are performed in the same semiconductor processing tool.

14. The method of claim 13, wherein said deposition processes and said ion implantations are performed in the same chamber of the same semiconductor processing tool.

15. A method, comprising:
providing a semiconductor structure comprising a substrate and a transistor element, said transistor element comprising a gate structure formed over said substrate;
performing one uninterrupted deposition process to deposit a first portion of a layer of spacer material and a second portion of the layer of spacer material over said substrate and said gate structure;
implanting ions into said first portion of said layer of spacer material; and
implanting ions into said second portion of said layer of spacer material, wherein at least the implantation of ions into said first portion of said layer of spacer material is performed during the uninterrupted deposition process.

16. The method of claim 15, wherein at least a part of the implantation of ions into said second portion of said layer of spacer material is performed during the uninterrupted deposition process.

17. The method of claim 15, wherein the implantation of ions into said first portion of said layer of spacer material and the implantation of ions into said second portion of said layer of spacer material are performed in one uninterrupted ion implantation process, wherein at least a part of the uninterrupted ion implantation process is performed at the same time as at least a part of the uninterrupted deposition process.

18. A method, comprising:
providing a semiconductor structure comprising a substrate and a transistor element, said transistor element comprising a gate structure formed over said substrate, wherein said substrate has a thickness direction, wherein an extension of said substrate in said thickness direction is smaller than an extension of said substrate in a first horizontal direction and an extension of said substrate in a second horizontal direction;
depositing a first portion of a layer of spacer material over said substrate and said gate structure;
implanting ions into said first portion of said layer of spacer material;
depositing a second portion of said layer of spacer material over said first portion of said layer of spacer material; and
implanting ions into said second portion of said layer of spacer material;
wherein at least a part of the implantation of ions into said first portion of said layer of spacer material is performed before the deposition of said second portion of said layer of spacer material and wherein, in each of the implantation of ions into said first portion of said layer of spacer material and the implantation of ions into said second portion of said layer of spacer material, the ions are irradiated to the semiconductor structure at a nonzero tilt angle to said thickness direction of said substrate.

19. The method of claim 18, wherein said tilt angle has a value in a range from about 10-40 degrees.

20. The method of claim 18, further comprising rotating said semiconductor structure around an axis of rotation that is parallel to said thickness direction of said substrate during the implantation of ions into said first portion of said layer of spacer material and the implantation of ions into said second portion of said layer of spacer material.

* * * * *